(12) United States Patent
Terashi et al.

(10) Patent No.: US 6,572,955 B2
(45) Date of Patent: Jun. 3, 2003

(54) CERAMICS HAVING EXCELLENT HIGH-FREQUENCY CHARACTERISTICS AND METHOD OF PRODUCING THE SAME

(75) Inventors: Yoshitake Terashi, Kokubu (JP); Masahiro Tomisako, Kokubu (JP); Satoshi Hamano, Kokubu (JP); Kazuyoshi Kodama, Kokubu (JP); Katsuhiko Onitsuka, Kokubu (JP)

(73) Assignee: Kyocera Corporation, Kyoto (JP)

( * ) Notice: Subject to any disclaimer, the term of this patent is extended or adjusted under 35 U.S.C. 154(b) by 160 days.

(21) Appl. No.: 09/844,835

(22) Filed: Apr. 27, 2001

(65) Prior Publication Data

US 2002/0169063 A1 Nov. 14, 2002

(30) Foreign Application Priority Data

Apr. 27, 2000 (JP) ........................ 2000-127838

(51) Int. Cl.$^7$ ..................... C03C 10/04; C03C 10/10; H01L 23/15
(52) U.S. Cl. ................. 428/209; 428/633; 428/671; 428/672; 428/336; 428/469; 428/697; 428/702; 428/901; 501/5; 501/6; 501/10; 501/32
(58) Field of Search .............. 501/2, 4, 5, 6, 501/9, 10, 32; 428/209, 469, 697, 702, 901, 621, 632, 633, 671, 672, 336

(56) References Cited

U.S. PATENT DOCUMENTS 6,121,173 A * 9/2000 Terashi ................. 501/4
6,201,307 B1 * 3/2001 Terashi et al. .......... 257/784

FOREIGN PATENT DOCUMENTS

| JP | 03060443 A | * | 3/1991 |
| JP | 04238858 A | * | 8/1992 |
| JP | 05116986 A | * | 5/1993 |
| JP | 09142880 A | * | 6/1997 |
| JP | 11017294 A | * | 1/1999 |
| JP | 11102996 A | * | 4/1999 |

* cited by examiner

Primary Examiner—Deborah Jones
Assistant Examiner—Stephen Stein
(74) Attorney, Agent, or Firm—Hogan & Hartson, LLP

(57) ABSTRACT

High-frequency ceramics containing $SiO_2$, $Al_2O_3$, MgO, ZnO and $B_2O_3$ as constituent components, said ceramics comprising: 30 to 50% by weight of a crystal phase containing ZnO and $Al_2O_3$; 5 to 15% by weight of a crystal phase containing $SiO_2$ and MgO; and 40 to 60% by weight of an amorphous phase comprising substantially $SiO_2$ or $SiO_2$ and $B_2O_3$; wherein the content of the $SiO_2$ crystal phase is suppressed to be not larger than 6% by weight. The ceramics has a dielectric loss at 60 GHz of not larger than $15 \times 10^{-4}$, exhibiting excellent high-frequency characteristics, and is very useful as an insulating substrate for the wiring boards that deal with high-frequency signals.

4 Claims, 2 Drawing Sheets

- SP
- E
- Si
- G

CERAMICS HAVING EXCELLENT HIGH-FREQUENCY CHARACTERISTICS AND METHOD OF PRODUCING THE SAME

BACKGROUND OF THE INVENTION

1. Field of the Invention

The present invention relates to ceramics having excellent high-frequency characteristics (hereinafter often called high-frequency ceramics) and, particularly, to high-frequency ceramics favorably used as high-frequency wiring boards and insulating substrates that can be co-fired with a low-resistance conductor such as copper or silver, and that are used for a variety kinds of devices for transmitting high-frequency signals of microwaves or millimeter waves, such as semiconductor element-containing packages, dielectric resonators, LC filters, capacitors, dielectric waveguides and dielectric antennas.

2. Description of the Prior Art

As a ceramic multi-layer wiring board, there has heretofore been used the one in which a wiring layer of a high-melting metal such as tungsten or molybdenum is formed on the surface of or inside of the insulating substrate of an aluminous sintered product. In recent years facing the era of information technology, further, the frequency band that is used is shifting toward higher frequencies.

In such high-frequency wiring boards, it is required that the conductor forming a wiring layer has a small resistance from the standpoint of transmitting high-frequency signals without loss and that the dielectric loss of the insulating substrate is small in the high-frequency region.

However, the existing high-melting metals such as tungsten(W) and molybdenum (Mo) have large resistances, transmit signals at slow speeds, and make it difficult to transmit signals in high-frequency regions. For the high-frequency wiring boards that treat high-frequency signals in a millimeter region of not lower than, for example, 30 GHz, the above-mentioned high-melting metals cannot be used. It therefore becomes necessary to use a low-resistance metal such as copper, silver or gold to substitute for the high-melting metals.

However, the low-resistance metals have low melting points and cannot be co-fired with the ceramics such as alumina. Therefore, there has been developed a wiring board using, as an insulating substrate, glass ceramics which is a composite material of a glass and ceramics.

Japanese Unexamined Patent Publication (Kokai) No. 240135/1985 proposes a multi-layer wiring board obtained by co-firing a zinc borosilicate glass to which are added such fillers as $Al_2O_3$, zirconia and mullite, together with a low-resistance metal. Further, Japanese Unexamined Patent Publication (Kokai) No. 298919/1993 proposes a glass ceramic material in which mullite and cordierite are precipitated as crystal phases.

On the other hand, to the wiring board are connected various electronic parts and the input/output terminals depending upon the applications. Therefore, the wiring board is often cracked or damaged due to stress exerted in the step of connection. To prevent such inconvenience, the insulating substrate in the wiring board must have a high mechanical strength.

The present applicant therefore has proposed in a previously filed Japanese Unexamined Patent Publication (Kokai) No. 275963/1998 ceramics having an excellent mechanical strength and excellent high-frequency characteristics. The ceramics contains a spinel crystal phase containing ZnO and $Al_2O_3$, an $SiO_2$ crystal phase and an enstatite crystal phase, and contains an amorphous phase comprising substantially $SiO_2$ or $SiO_2$ and $B_2O_3$, has a large mechanical strength, a small dielectric loss in the high-frequency band, and is very useful as an insulating substrate for a high-frequency wiring board. The above ceramics is obtained by preparing a slurry by adding an organic binder to a mixture of starting materials of a ZnO powder and an amorphous silica powder added to a glass powder that contains $SiO_2$, $Al_2O_3$, MgO, ZnO and $B_2O_3$ at a particular ratio, forming a green sheet by using this slurry, and firing the obtained green sheet at 825 to 975° C.

However, though the glass ceramics disclosed in Japanese Unexamined Patent Publications (Kokai) Nos. 240135/1985 and 298919/1993 can be co-fired together with a low-resistance metal such as copper, silver or gold, they, generally, exhibit large dielectric losses in a high-frequency band and low mechanical strengths. For example, the above glass ceramic sintered product has a strength of about 15 $kg/mm^2$ which is very smaller than that of the aluminous sintered product.

On the other hand, the ceramics disclosed in Japanese Unexamined Patent Publication (Kokai) No. 275963/1998 exhibits a large mechanical strength but has a problem in that it expands at high temperatures (e.g., has the coefficient of thermal expansion of larger than 8 ppm/° C). That is, a large difference in the thermal expansion is exhibited from the high-frequency elements (having coefficients of thermal expansion of 5 to 8 ppm/° C.) such as GaAs chip and SiGe chip used in high-frequency bands such as of microwaves and millimeter waves. Therefore, the wiring board equipped with the insulating substrate formed of the above ceramics produces a thermal stress on the interface between the high-frequency element and the insulating board due to heat generated during the operation of the high-frequency element and at the time of mounting the high-frequency element, resulting in the occurrence of cracks. Besides, the above ceramics is not fully satisfactory from the standpoint of dielectric loss in a high-frequency region.

SUMMARY OF THE INVENTION

It is therefore an object of the present invention to provide high-frequency ceramics that can be produced by firing at not higher than 1000° C., that can be co-fired with a low-resistance conductor of gold, silver or copper, that exhibits a large strength, and that exhibits a small dielectric loss even in a high-frequency region, and a method of producing the same.

It is another object of the present invention to provide a high-frequency wiring board equipped with an insulating substrate formed of the above high-frequency ceramics.

The present inventors have closely studied the ceramics disclosed in Japanese Unexamined Patent Publication (Kokai) No. 275963/1998 proposed earlier by the present applicant, have discovered a novel fact that the ceramics exhibits a large coefficient of thermal expansion and a large dielectric loss in a high-frequency region (e.g., 60 GHz) since $SiO_2$ crystals such as quartz are precipitated in large amounts (e.g., not smaller than 10% by weight) and that the amount of $SiO_2$ crystals that are precipitated vary depending upon the amount of impurity metals contained in the amorphous silica starting material, and have completed the invention.

That is, the present invention provides ceramics having excellent high-frequency characteristics which contain SiO$_2$, Al$_2$O$_3$, MgO, ZnO and B$_2$O$_3$ as constituent components, said ceramics comprising:

30 to 50% by weight of a crystal phase containing ZnO and Al$_2$O$_3$;

5 to 15% by weight of a crystal phase containing SiO$_2$ and MgO; and 40 to 60% by weight of an amorphous phase comprising substantially SiO$_2$ or SiO$_2$ and B$_2$O$_3$;

wherein a content of an SiO$_2$ crystal phase is suppressed to be not larger than 6% by weight, and the dielectric loss at 60 GHz is not larger than $15 \times 10^{-4}$.

The invention further provides a method of producing ceramics having excellent high-frequency characteristics, comprising:

preparing a mixture of starting materials of 65 to 85% by weight of a crystallized glass containing SiO$_2$, Al$_2$O$_3$, MgO, ZnO and B$_2$O$_3$, 5 to 20% by weight of a ZnO powder, and 1 to 20% by weight of an amorphous silica powder containing not larger than 500 ppm of impurities calculated as metals;

preparing a slurry by adding an organic binder to said mixture;

molding said slurry; and removing the binder from the obtained molded article, followed by firing at 800 to 1000° C.

The invention further provides a high-frequency wiring board comprising an insulating substrate formed of the above-mentioned ceramics, and a wiring layer formed on the surface of and/or inside of the insulating substrate and is capable of transmitting signals of high frequencies of not lower than 1 GHz.

The present invention relates to an improvement in the ceramics disclosed in Japanese Unexamined Patent Publication (Kokai) No. 275963/1998. The high-frequency ceramics of the present invention is greatly different from the ceramics of the prior art with respect to that the content of the SiO$_2$ crystals is suppressed to be not larger than 6% by weight. Upon suppressing the content of SiO$_2$ crystals, the dielectric loss at 60 GHz is as low as $15 \times 10^{-4}$ as demonstrated by experimental examples appearing later, and the coefficient of thermal expansion at room temperature through up to 400° C. is in a range of 5 to 8 ppm/° C. which is close to that of high-frequency elements such as GaAs chip and SiGe chip. As a result, the high-frequency ceramics of the present invention can be very effectively used as an insulating substrate for the high-frequency wiring boards.

That is, like the ceramics of the above prior art, the high-frequency ceramics of the present invention is produced by using a mixed powder of a crystallized glass containing SiO$_2$, Al$_2$O$_3$, MgO, ZnO and B$_2$O$_3$, a ZnO powder and an amorphous silica powder. Here, impurity metals such as aluminum, iron and antimony contained in the amorphous silica powder and other oxides of impurity metals, seriously affect the precipitation of SiO$_2$ crystals such as quartz. Concretely speaking, when the amounts of impurities contained in the amorphous silica powder are great, the crystallization of amorphous silica is promoted during the firing, SiO$_2$ crystals precipitate in large amounts, the obtained ceramics exhibits a large coefficient of thermal expansion and increased dielectric loss in the high-frequency regions. According to the present invention, use of a highly pure amorphous silica in which the content of impurities is suppressed to be not larger than 500 ppm calculated as metals, contributes to suppressing the crystallization of amorphous silica during the firing and makes it possible to obtain the ceramics in which the content of SiO$_2$ crystals is suppressed to be not larger than 6% by weight.

DETAILED DESCRIPTION OF THE INVENTION (High-Frequency Ceramics)

The high-frequency ceramics of the present invention contains SiO$_2$, Al$_2$O$_3$, MgO, ZnO and B$_2$O$_3$ as essential constituent components and usually contains these oxides at ratios as described below.

SiO$_2$: 30 to 60% by weight and, particularly, 40 to 50% by weight,

Al$_2$O$_3$: 18 to 25% by weight and, particularly, 20 to 25% by weight,

MgO: 5 to 10% by weight and, particularly, 8 to 9% by weight,

ZnO: 5 to 35% by weight and, particularly, 10 to 20% by weight, and

B$_2$O$_3$: 5 to 10% by weight and, particularly, 5.5 to 7% by weight.

Figure 1:
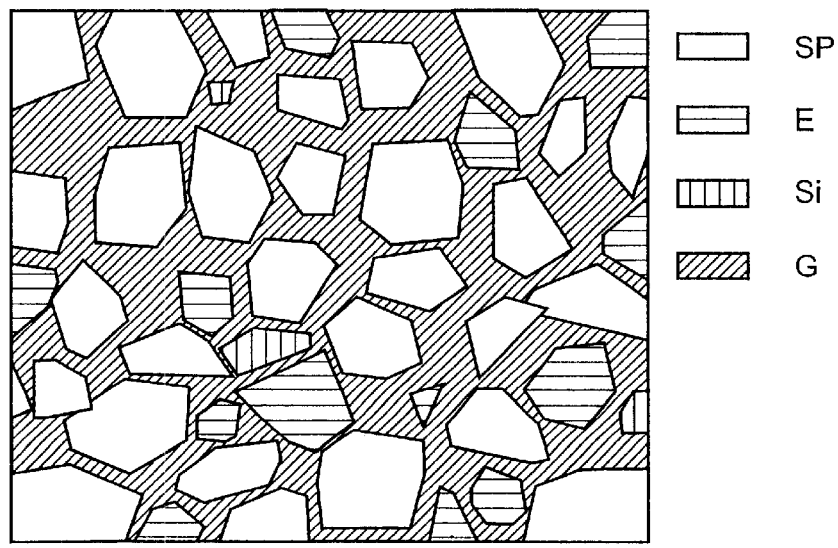
FIG. 1 is a schematic diagram illustrating the texture of high-frequency ceramics of the present invention.

The high-frequency ceramics of this composition contains, as shown in FIG. 1, various crystal phases and an amorphous phase (denoted by G in FIG. 1). As the crystal phases, it is essential that there must have been precipitated a crystal phase (denoted by SP in FIG. 1) containing ZnO and Al$_2$O$_3$ and a crystal phase (denoted by E in FIG. 1) containing SiO$_2$ and MgO.

As the crystal phase (SP) containing ZnO and Al$_2$O$_3$, there can be exemplified spinel crystal phases such as gahnite crystal phase (ZnAl$_2$O$_4$), and (Zn, Mg)Al$_2$O$_4$ crystal phase. Among them, the gahnite crystal phase is particularly preferred. In the present invention, the crystal phase (SP) is contained in an amount of from 30 to 50% by weight. When this amount is smaller than 30% by weight, it is not allowed to accomplish both a large strength and a small dielectric loss of the ceramics. When this amount is larger than 50% by weight, on the other hand, the ceramics exhibits an increased coefficient of thermal expansion.

As the crystal phase (E) containing SiO$_2$ and MgO, there can be exemplified enstatite crystal phases such as an enstatite crystal phase (MgSiO$_3$), a clinoenstatite crystal phase and a protoenstatite crystal phase, as well as a forsterite crystal phase. Among them, the enstatite crystal phase is particularly desired from the standpoint of a low dielectric loss in a high-frequency band and a large strength of the ceramics. In the present invention, the content of the crystal phase (E) is set to lie in a range of from 5 to 15% by weight. When the content is smaller than 5% by weight, the effect is not sufficient for decreasing the dielectric loss of the ceramics. When the content is larger than 15% by weight, on the other hand, the ceramics exhibits an increased coefficient of thermal expansion.

In the present invention as shown in FIG. 1, there may be precipitated an $SiO_2$ crystal phase (denoted by Si in FIG. 1) such as quartz or cristobalite. Here, however, it is very important that the content of the crystal phase (Si) has been suppressed to be not larger than 6% by weight. That is, when the $SiO_2$ crystal phase (Si) precipitates in an amount of larger than 6% by weight, the dielectric loss increases in the high-frequency band and, besides, the ceramics exhibits an increased coefficient of thermal expansion decreasing the reliability for mounting the high-frequency element. To set the amount of precipitation of the $SiO_2$ crystal phase (Si) to lie within the above-mentioned range, there may be used an amorphous silica powder of a high purity in which the amount of impurity metals has been suppressed to be not larger than a predetermined value as will be described later. Trace amounts of impurity metals (Al, Fe, Sb, etc.) contained in the amorphous powder of a high purity usually exist as solid solutions in any one of the above-mentioned crystal phases, for example, in the spinel crystal phase (SP).

In the present invention, further, the willemite crystal phase (not shown) represented by $Zn_2SiO_4$ precipitates depending upon the composition of the crystallized glass used for precipitating the above-mentioned crystal phases. Here, however, it is desired that the amount of precipitation of the willemite crystal phase is suppressed to be not larger than 6% by weight from the standpoint of decreasing the dielectric loss in the high-frequency region and decreasing the coefficient of thermal expansion.

There are further precipitated other crystal phases such as a crystal phase (not shown) represented by $Mg_2B_2O_5$ and a cordierite crystal phase (not shown) in addition to the above-mentioned various crystal phases. It is, however, desired that the total amount of precipitation of other crystal phases is not larger than 3% by weight.

The amorphous phase (G) substantially comprises $SiO_2$ or $SiO_2$ and $B_2O_3$ and is present at a ratio of from 40 to 60% by weight and, particularly, from 45 to 55% by weight. The presence of the amorphous phase (G) makes it possible to decrease the dielectric loss of the ceramics in a high-frequency band and to decrease the dielectric constant of the ceramics. When there are precipitated in the amorphous phase (G) the components such as $Al_2O_3$, ZnO and MgO (components other than $SiO_2$ and $B_2O_3$) that are contained in the crystallized glass used for precipitating the above-mentioned various crystal phases, the dielectric loss of the amorphous phase (G) increases in the high-frequency band and, hence, the ceramics exhibits an increased dielectric loss in the high-frequency band. It is therefore desired that the contents of these components (other than $SiO_2$ and $B_2O_3$) in the amorphous phase (G) are not larger than 50 ppm, respectively, and that the total amount thereof is not larger than 100 ppm. It is desired that these components are all precipitated substantially as crystal phases.

In the above-mentioned amorphous phase (G), it is desired that the content of $B_2O_3$ is not larger than 100 ppm and, particularly, not larger than 50 ppm from the standpoint of decreasing the dielectric loss of the ceramics, and it is most desired that the amorphous phase (G) is substantially formed of $SiO_2$ only. That is, $B_2O_3$ is contained in the crystallized glass used as a starting material and is desired to be crystallized as $Mg_2B_2O_5$ during the firing or is present as a solid solution in the above-mentioned various crystal phases and, particularly, in the enstatite crystal phase (E).

The high-frequency ceramics of the invention containing the above-mentioned main crystal phases and the amorphous crystal phase, exhibits not only a large strength but also a dielectric constant which is not larger than 6, exhibits a dielectric loss (tan δ) at 15 GHz of as small as $10 \times 10^{-4}$ or less, a dielectric loss (tan δ) at 60 GHz of $15 \times 10^{-4}$ or less and, particularly, $10 \times 10^{-4}$ or less, and exhibits a coefficient of thermal expansion in a range of from 5 to 8 ppm/° C. at room temperature up to 400° C. which is very close to the coefficient of thermal expansion of a semiconductor element such as GaAs chip or the like chip. Therefore, the high-frequency ceramics of the present invention is very useful as an insulating substrate for a high-frequency wiring board.

Further, the high-frequency ceramics of the present invention may contain a Co component in an amount of 0.05 to 5% by weight and, particularly, 0.1 to 2.0% by weight calculated as CoO in addition to the above-mentioned components. The Co-containing ceramics is very useful for the wiring board provided with a Cu wiring layer.

That is, Cu, Ag and Au are representatively used as low-resistance conductors for forming wiring layers. From the standpoint of cost, however, Cu and Ag are usually used. Among them, the Ag wiring layer can be formed by firing in the open air and, besides, no layer needs be plated on the surface thereof, offering an advantage from the standpoint of cost leaving, however, problems in regard to migration on the surfaces of the wiring layers and wettability of the solder. Therefore, the Cu wiring layer free from such problems are most generally used. The Cu wiring layer, however, must be plated with a layer of Ni—Au or Cu—Au on the surface thereof to prevent the oxidation. When the insulating substrate in the wiring board is formed of the widely known ceramics, however, Au adheres onto the surface of the insulating substrate at the time of plating the layer on the surface of the Cu wiring layer causing discoloration and a drop in the insulating property among the wiring layers.

The above-mentioned ceramics containing the Co component has an advantage of effectively preventing the adhesion of Au at the time of plating the layer. In this case, when the Co content increases, the dielectric loss may increase. When the Co content decreases, the effect is not exhibited to a sufficient degree to prevent the adhesion of Au. It is therefore desired that the Co content has been set to lie within the above-mentioned range.

The Co component exists in the form of Coo in various crystal phases and in the amorphous phase in the ceramics and, in particular, the distribution of Zn is in good agreement with the distribution of Co in the ceramics, from which the present inventors presume that the adhesion of Au is effectively prevented since Zn in the crystal phase is partly substituted by Co. From this fact, further, it is desired that the Co component is contained in the crystal phase (SP) that contains ZnO and $Al_2O_3$ and in the amorphous phase (G).

It is further desired that the Co component is homogeneously dispersed in the ceramics. When the Co component is partly aggregated in the ceramics and is not homogeneously dispersed, the aggregation of Co component may increase the dielectric loss and may further develop protuberance-like defects through firing. The ceramics in which the Co component is homogeneously dispersed exhibits a vivid color and assumes the following color position when evaluated by, for example, an L*a*b color display system, Brightness L*>80

Chroma $C^* = \{(a^*)^2 + (b^*)^2\}^{1/2} > 20$ (Preparation of High-Frequency Ceramics)

Starting Material Powder

As the starting material powders used for the preparation of a high-frequency ceramics of the present invention, there is used a mixed powder of a crystallized glass powder, a ZnO powder and an amorphous silica powder (fused silica).

In order to precipitate the above-mentioned various crystal phases, the crystallized glass powder contains $SiO_2$, $Al_2O_3$, MgO, ZnO and $B_2O_3$. In order that the amorphous phase in the ceramics comprises substantially $SiO_2$ or $SiO_2$ and $B_2O_3$, and that the remainder is crystallized, however, it is desired that the glass powder has the following composition:

$SiO_2$: 40 to 52% by weight and, particularly, 45 to 50% by weight $Al_2O_3$: 14 to 32% by weight and, particularly, 25 to 30% by weight MgO: 4 to 15% by weight and, particularly, 9 to 13% by weight ZnO: 6 to 16% by weight and, particularly, 6 to 10% by weight $B_2O_3$: 5 to 15% by weight and, particularly, 7 to 11% by weight It is desired that the crystallized glass powder has an average particle diameter of 1 to 10 μm and, particularly, 1.5 to 4 μm and that the ZnO powder has an average particle diameter of 0.5 to 5 μm and, particularly, 0.8 to 2.5 μm.

The amorphous silica (fused silica) powder is of a very high purity in which the total amount of impurity metals such as aluminum, iron, antimony, etc. contained in the starting sodium silicate or infiltrated in the step of preparing amorphous silica has been decreased to be not larger than 500 ppm calculated as metals. By using such a highly pure amorphous silica (fused silica) powder, the crystallization of amorphous silica is effectively suppressed during the firing, the amount of precipitation of the $SiO_2$ crystal phase is suppressed to lie within the above-mentioned range, and the dielectric loss can be decreased in the high-frequency region. Besides, since the amount of precipitation of the $SiO_2$ crystal phase has been suppressed, the coefficient of thermal expansion of the obtained ceramics lies in a range of 5 to 8 ppm/° C. at room temperature up to 400° C., which is very close to the coefficient of thermal expansion of a semiconductor device such as GaAs chip.

It is desired that such a highly pure amorphous silica powder has an average particle diameter in a range of from 1.2 to 6 μm and, particularly, from 1.5 to 3.5 μm, and in which the content of particles having particle diameters of not smaller than 2 μm is not smaller than 15% by weight and is, particularly, in a range of from 15 to 30% by weight. Use of the amorphous silica powder having the above-mentioned particle diameter distribution is most desired from the standpoint of setting the contents of the crystal phases to be at a predetermined ratio in the ceramics and constituting the amorphous phase by $SiO_2$ only or by $SiO_2$ and $B_2O_3$ only in the ceramics.

In the present invention, further, the mixing ratio of the crystallized glass powder, ZnO powder and amorphous silica powder is such that the amount of the crystallized glass powder is from 65 to 85% by weight, the amount of the ZnO powder is from 5 to 20% by weight and, particularly, from 7 to 15% by weight, and the amount of the amorphous silica powder is from 3 to 20% by weight and, particularly, from 10 to 20% by weight in the mixed powder. Upon mixing the powders at such a ratio, the amounts of the precipitated crystal phases can be set to lie within the above-mentioned ranges.

To prepare the above-mentioned Co-containing ceramics according to the invention, the above mixed powder is further blended with a CoO powder or a $Co_3O_4$ powder in an amount of 0.05 to 5% by weight and, particularly, 0.1 to 2.0% by weight calculated as CoO. To homogeneously disperse Co in the ceramics, in this case, it is desired to use a $Co_3O_4$ powder having a specific surface area (BET) of not smaller than 10 m²/g. $Co_3O_4$ releases oxygen upon heating and is converted into CoO, promoting the removal of the binder due to oxygen that is released. It is therefore advantageous to use the $Co_3O_4$ powder from the standpoint of effectively removing the binder and decreasing the amount of carbon remaining in the ceramics.

Preparation and Molding of the Slurry for Molding

An organic binder such as polyvinyl alcohol or methacrylate resin is added to the mixed powder obtained above. As required, further, a plasticizer such as dibutyl phthalate or dioctyl phthalate and an organic solvent such as toluene, ethyl acetate or isopropanol are added thereto in suitable amounts to prepare a slurry for molding.

By using the above slurry for molding, a molded article of a shape that meets the use is obtained by a known molding method such as doctor blade method, calendar roll method, rolling method or press-molding method, followed by the removal of binder and firing.

Here, when a high-frequency wiring board is to be prepared, a sheet-like molded article (green sheet) having a predetermined thickness is prepared and, as desired, through-holes are formed in the green sheet and are filled with a metal paste containing at least one of copper, silver or gold. Further, onto the surface of the green sheet is applied by printing the above-mentioned metal paste to form a high-frequency line pattern capable of transmitting high-frequency signals maintaining a wiring layer thickness of 5 to 30 μm by a known printing method such as screen-printing method or gravure-printing method.

Next, plural pieces of green sheets are laminated and adhered together with their through-holes and line patterns in position, and the laminated sheet is subjected to the removal of binder and to the firing.

Removal of Binder

The binder is removed by the heat treatment in a water vapor-containing atmosphere. Upon effecting the heat treatment in such an atmosphere, carbon that remains after the thermal decomposition of the binder reacts with the water vapor making it possible to effectively remove the binder. As described above, further, when the $Co_3O_4$ powder is used, removal of the binder is promoted by oxygen released at the time when $Co_3O_4$ is converted into CoO. When the Cu wiring layer is formed by co-firing, the binder is removed in a nonoxidizing atmosphere (e.g., nitrogen atmosphere) containing water vapor to prevent the oxidation of Cu.

It is desired that the binder is so removed that the amount of residual carbon becomes not larger than 100 ppm and, particularly, not larger than 80 ppm. When carbon remains in large amounts, the density of the ceramics decreases, dielectric loss increases and insulating property decreases. Besides, upon firing, protuberance-like defects may occur on the surface of the ceramics. In particular, when the wiring board having the insulating substrate comprising the above ceramics is to be prepared by the co-firing of the wiring layer of the low-resistance conductor, protuberance-like defects that occur on the surface of the wiring layer of the low-resistance conductor impairs reliability of connection between the wiring board and the external element to a conspicuous degree. In the present invention, the amount of residual carbon is adjusted to lie within the above-mentioned range to effectively avoid these inconveniences.

To suppress the amount of residual carbon to lie within the above-mentioned range in the present invention, it is desired that the binder is removed through the heat treatment in two stages. It is desired to remove the binder by the heat treatment in two stages, e.g., 650 to 710° C. and 720 to 770° C. In particular, it is most desired to effect the heat treatment at 650 to 710° C. for more than one hour and, then, at 720 to 770° C. for more than one hour from the standpoint of suppressing the amount of remaining carbon to lie within the above-mentioned range.

Firing

After the binder has been removed, the firing is effected in a nonoxidizing atmosphere such as nitrogen atmosphere or in an oxidizing atmosphere such as open air. When the Cu wiring layer is to be formed by co-firing, however, the firing is performed in the nonoxidizing atmosphere to prevent the oxidation of Cu.

The firing is conducted in the above atmosphere at 800 to 1000° C. and, particularly, at 875 to 1000° C. for more than 0.5 hours to thereby obtain high-frequency ceramics of the invention which is dense containing the above-mentioned various crystal phases and amorphous phase and to obtain a high-frequency wiring board using the high-frequency ceramics as the insulating substrate.

After firing, the wiring board (using a Cu paste as the metal paste) having the Cu wiring layer is subjected to the nonelectrolytic Ni—Au plating or nonelectrolytic Cu—Au plating to form a plated layer on the Cu wiring layer on the surface of the substrate. When the insulating substrate is formed of high-frequency ceramics containing the Co component, adhesion of Au to the surface of the insulating substrate is effectively suppressed.

As desired, further, a high-frequency device such as of Si, GaAs or SiGe is mounted on the surface of the thus formed wiring substrate and is connected to the wiring layer formed on the wiring board so as to transmit high-frequency signals. For example, it is allowable to directly mount the high-frequency device on the surface of the wiring layer via a solder, or to connect the high-frequency device by using wire bonding or TAB tape.

On the surface of the wiring substrate mounting the high-frequency device, further, there can be joined, as desired, a cap made of an insulating material same as the insulating substrate, or any other insulating material, or made of a metal having good heat-radiating property by using an adhesive such as glass, resin or brazing material, in order to air-tightly seal the high-frequency element and, thereby, to prepare a high-frequency semiconductor module.

(Structure of the High-Frequency Wiring Board)

The high-frequency wiring board equipped with the insulating substrate formed of the above-mentioned high-frequency ceramics can assume a variety of structures.

Figure 2:
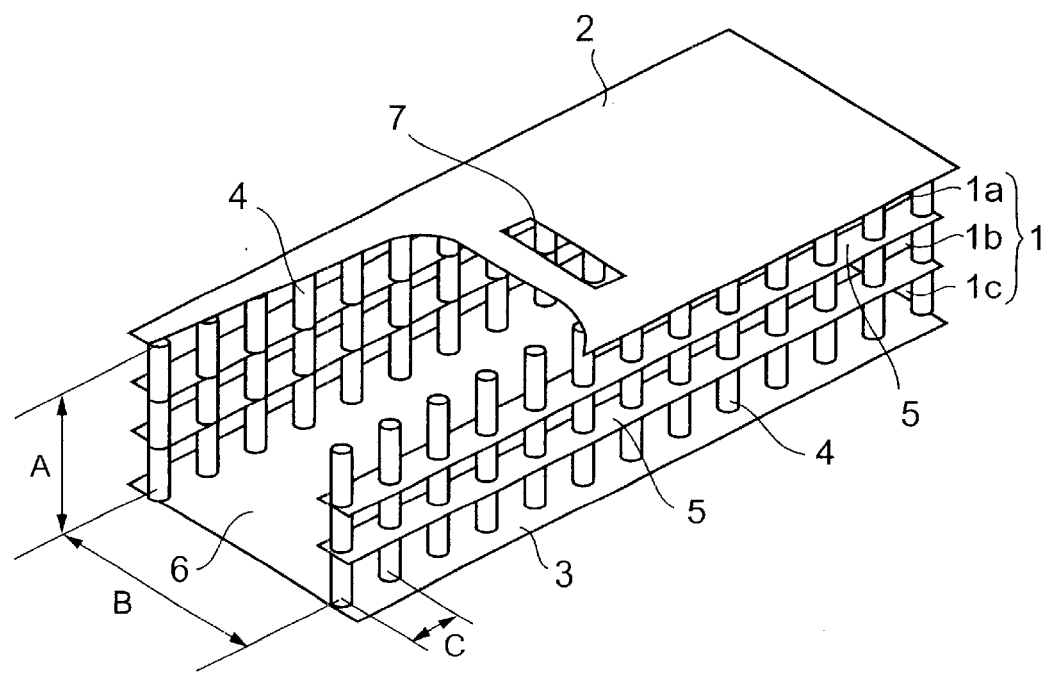
FIG. 2 is a perspective view schematically illustrating, in cross section, a high-frequency wiring board equipped with a dielectric antenna, which is a high-frequency wiring board using the high-frequency ceramics of the present invention.

Referring to FIG. 2 which is a perspective view schematically illustrating, in cross section, the high-frequency wiring board, an insulating substrate 1 having a predetermined thickness A is constituted by three insulating layers 1a, 1b and 1c. Further, a pair of conductor layers 2 and 3 are formed to hold the insulating substrate 1.

The insulating substrate 1 has many via-holes 4 formed therein extending in the direction of thickness thereof, and the electrically conducting layers 2 and 3 are electrically connected together through these via-holes 4.

As will be obvious from FIG. 2, the via-holes 4 are arranged in two rows maintaining a predetermined distance B, the via-holes 4 in each row being arranged maintaining a predetermined distance C, and the rows of the via-holes 4 extending in the direction in which the signals are transmitted (in the direction in which the lines are formed). That is, space surrounded by these via-holes 4 and electrically conducting layers 2, 3 serves as a dielectric waveguide line 6.

There is no particular limitation on the thickness A of the insulating substrate 1. When high-frequency signals of a single mode are used, however, the thickness is determined based on the distance B between the rows of via-holes 4, i.e., determined to be about B/2 or about 2B.

The distance C among the via-holes 4 in each row is set to be narrower than the wavelength $\gamma c$ (cut-off wavelength) of the signals that are transmitted thereby to form an electric wall. Therefore, the signals are confined between two rows of via-holes 4 and 4. The TEM waves are allowed to propagate between the pair of electrically conducting layers 2 and 3 arranged in parallel. Therefore, when the distance C among the via-holes 4 is longer than the cut-off wavelength $\gamma c$, the electromagnetic waves that are fed do not propagate therethrough. When the distance C among the via-holes is shorter than the cut-off wavelength $\gamma c$, the electromagnetic waves are cut off in a direction perpendicular to the line 6 but propagate being reflected within the dielectric waveguide line 6 surrounded by the electrically conducting layers 2, 3 and via-holes 4.

In FIG. 2, further, electrically conducting layers 5 are formed in a region where a row of via holes is formed among the insulating layers 1a, 1b and 1c to intensify the effect for cutting off the electromagnetic waves.

In FIG. 2, further, a slot 7 is formed in the electrically conducting layer 2 which forms one surface of the dielectric waveguide line 6, and the high-frequency signals transmitted through the dielectric waveguide line 6 are emitted through the slot 7. Therefore, the dielectric waveguide line 6 works as a waveguide antenna.

Figure 3:
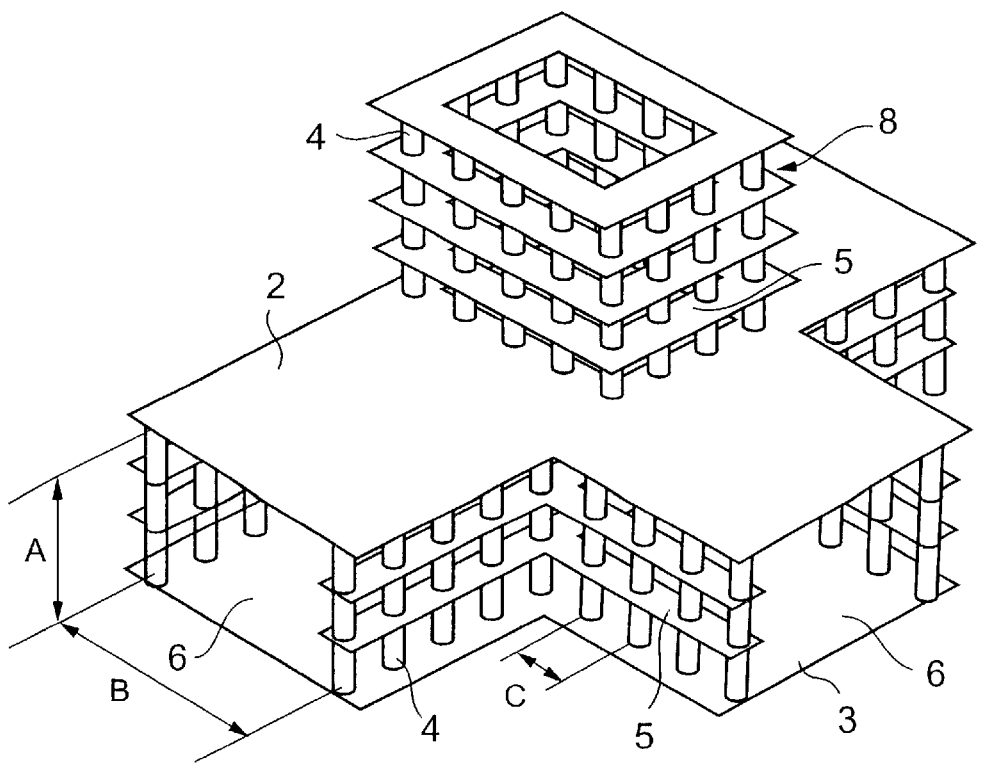
FIG. 3 is a perspective view schematically illustrating, in cross section, a high-frequency wiring board equipped with a dielectric antenna of a structure different from that of FIG. 2, which is a high-frequency wiring board using the high-frequency ceramics of the present invention.

Referring to FIG. 3, further, another dielectric waveguide line 8 can be connected so as to surround the slot (not shown) formed in the surface of the electrically conducting layer 2. In the examples of FIGS. 2 and 3, further, via-hole conductors (not shown) may be provided to penetrate through the slot, to extend the slot 7 to the outer side of the dielectric waveguide line 6 to take out the high-frequency signals.

It is further allowable to mount a high-frequency element (not shown) on the surface of the insulating substrate 1 and, particularly, on the back surface in which the slot 7 is formed.

As described already, the high-frequency ceramics of the present invention exhibits a dielectric loss at 15 GHz of not larger than $10 \times 10^{-4}$ and a dielectric loss at 60 GHz of not larger than $15 \times 10^{-4}$, i.e., exhibits a very small dielectric loss in a high-frequency band. In the above-mentioned wiring board, therefore, the insulating substrate 1 is formed of the above-mentioned high-frequency ceramics so that high-frequency signals can be transmitted through the dielectric waveguide line 6 without being attenuated.

Further, the high-frequency ceramics of the invention has a dielectric constant of not larger than 6. In this regard, too, the wiring board equipped with the insulating substrate 1 formed of the high-frequency ceramics exhibits excellent high-frequency signal transmission characteristics.

The high-frequency ceramics of the present invention exhibits a coefficient of thermal expansion at room temperature to 400° C. of 5 to 8 ppm/° C. which is close to the coefficient of thermal expansion of the semiconductor element. Therefore, the wiring board equipped with the insulating substrate 1 formed of the high-frequency ceramics is very useful for the applications where the high-frequency elements are mounted.

Figure 4:
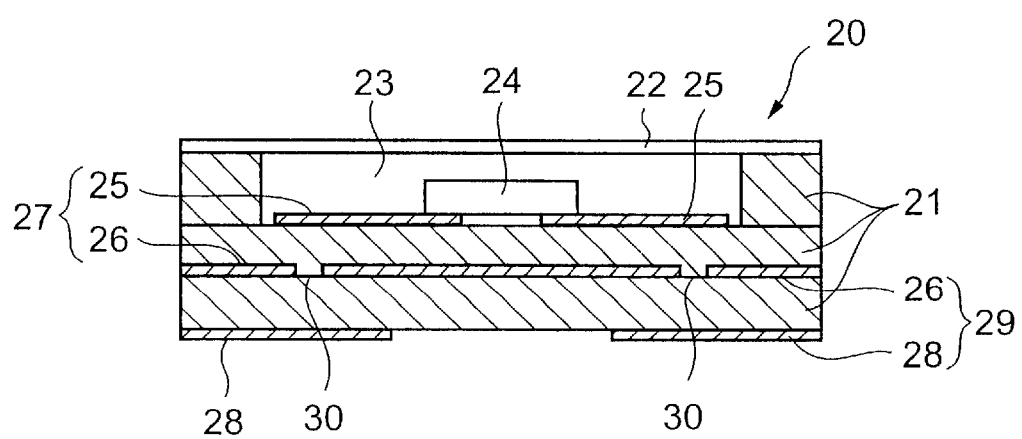
FIG. 4 is a side sectional view schematically illustrating a package for holding a semiconductor element, which is another high-frequency wiring board using the high-frequency ceramics of the present invention.

FIG. 4 is a side sectional view schematically illustrating a high-frequency package which is a preferred example of the high-frequency wiring board according to the invention.

In FIG. 4, a package which is generally designated at 20 is provided with insulating substrates 21 made of the high-frequency ceramics of the invention. In the upper surface of the insulating substrates 21 is formed a cavity 23 closed by a closure 22. A high-frequency element 24 such as Si, SiGe or GaAs is mounted in the cavity 23. It is desired that the closure 22 is made of a material capable of preventing the leakage of electromagnetic waves between the high-frequency element 24 and the outer side.

A wiring layer 25 is formed on the surface of the insulating substrate 21 and is electrically connected to the high-frequency element 24.

In order to transmit high-frequency signals of not lower than 1 GHz, particularly, not lower than 15 GHz, more particularly, not lower than 50 GHz and, further particularly, not lower than 70 GHz through the wiring layer 25 according to the present invention, it is desired that the wiring layer 25 has a shape of at least one kind selected from a strip line, a microstrip line, a coplanar line and a dielectric waveguide line. This makes it possible to decrease the transmission loss of high-frequency signals. In order to decrease the transmission loss of high-frequency signals, further, it is desired that the wiring layer 25 contains at least any one of low-resistance metals of copper, silver or gold and, particularly, contains these metals as main components.

In the package 20 of FIG. 4, a microstrip line 27 is formed of the wiring layer 25 and an earth layer 26. Further, a wiring layer 28 is formed on the back surface of the insulating substrate 21, is connected to an external circuit board, and forms a microstrip line 29 together with an earth layer 26. The wiring layers 25 and 28 have ends that are opposed to each other through a slot 30 formed in the earth layer 26 so as to be electromagnetically coupled together, and signals are transmitted involving little loss between the microstrip line 27 and the microstrip line 29.

In the present invention, the structure of the wiring layer is not limited to the above electromagnetic coupling structure only, but may be the one in which the above-mentioned dielectric waveguide line is laminated and arranged on the end of the microstrip line 27 shown in FIG. 4, and the dielectric waveguide line and the microstrip line 27 are connected together through a via-hole conductor that penetrates through the slot 30 formed in the earth layer 26.

In the package 20 of FIG. 4, further, the high-frequency element 24 is air-tightly sealed by the insulating substrate 21 and by the closure 22. The invention, however, is in no way limited thereto only but may be the one in which the high-frequency device 24 is sealed by being molded with a resin without forming the closure 22.

EXAMPLES

Experiment 1:

Four kinds of crystallized glasses were prepared having the following compositions.

Glass A: $SiO_2$, 44% by weight—$Al_2O_3$, 29% by weight—MgO, 11% by weight—ZnO, 7% by weight—$B_2O_3$, 9% by weight Glass B: $SiO_2$, 50% by weight—$Al_2O_3$, 15% by weight—MgO, 9% by weight—ZnO, 18% by weight—$B_2O_3$, 8% by weight Glass C: $SiO_2$, 10.4% by weight—$Al_2O_3$, 2.5% by weight—$B_2O_3$, 45.3% by weight—ZnO, 35.2% by weight—$Na_2O$, 6.6% by weight Glass D: $SiO_2$, 14.2% by weight—$Al_2O_3$, 24.5% by weight—$B_2O_3$, 22.6% by weight—CaO, 14.2% by weight—$Li_2O$, 12.8% by weight—$Na_2O$, 11.7% by weight The ZnO powder having an average particle diameter of 1 μm and amorphous silica powders having particle size distributions as shown in Table 1 were used as the crystallized glass powders and were so mixed together that the ceramics after fired possessed the compositions shown in Table 1. The particle diameters of the starting materials were measured by finding area ratios from the SEM photographs of the starting powders relying upon the Lusex's analytical method. The amorphous silica starting powders were further measured for their amounts of impurity metals by the ICP spectral method, infrared-ray absorption spectral method and Raman spectrometry as shown in Table 1.

To the obtained mixture powder were added an organic binder, a plasticizer and a toluene to prepare a slurry thereof which was, then, formed into a green sheet of a thickness of 300 μm by the doctor blade method. Ten to fifteen pieces of the green sheets were laminated one upon the other and were thermally adhered together at a temperature of 50° C. under a pressure of 10 MPa.

The thus obtained laminate was subjected to the processing for removing binder in a water vapor-containing nitrogen atmosphere (dew point of 60 ° C.) at 700° C. for 1 hour and, further, at 750° C. for 1 hour, and was fired in dry nitrogen under the conditions of Table 1 to obtain high-frequency ceramics.

Some samples employed a quartz powder which was crystalline $SiO_2$, $Al_2O_3$ powder or CaO powder as a filler component, instead of ZnO and amorphous silica, to prepare ceramics in the same manner (samples Nos. 9 to 11, 18). Besides, the sample No. 25 was subjected to the heat treatment of one stage at 750° C. for 1 hour.

The obtained ceramics were evaluated for their dielectric constants, dielectric losses, deflective strengths coefficients of thermal expansion and the amount of residual carbon according to methods described below, and were further analyzed for their components in the ceramics and were evaluated for their signal transmission properties. The results were as shown in Table 2.

Dielectric Constants and Dielectric Losses:

The sample ceramics was cut into a disk of a predetermined size and was measured by a dielectric cylindrical resonator method at 15 GHz or 60 GHz by using a network analyzer or a synthesized sweeper. In taking measurement, the dielectric resonator was excited with an NRD guide (nonradiating dielectric line), and the dielectric constants and the dielectric losses were calculated from the resonance characteristics in the $TE_{011}$ or $TE_{021}$ mode.

The dielectric losses at 15 GHz were measured by using the samples of the shape of a disk having a diameter of 10 mm and a thickness of 5 mm, and the dielectric losses at 60 GHz were measured by using the samples of the shape of a disk having diameters of 2 to 7 mm and thicknesses of 2.0 to 2.5 mm.

Deflective Strengths:

The sample was cut into a shape of a width of 4 mm, a thickness of 3 mm and a length of 70 mm and was measured for its deflective strength by the three-point flexural testing as stipulated under JIS C-2141.

Coefficients of Thermal Expansion:

A curve of thermal expansion was plotted from room temperature up to 400° C. to calculate the coefficients of thermal expansion.

Analysis of Components:

The crystal phases and amorphous phases in the ceramics were identified from a chart of X-ray diffraction, and were determined according to the Liedbert's method.

Further, the ratios of elements in the amorphous phase were measured by EDX (energy dispersive X-ray spectroscopy) by TEM analysis and EELS (electron energy loss spectroscopy), to confirm the elements having ratios of not smaller than 50 ppm.

Residual Carbon:

The amount of residual carbon is measured by the method of infrared absorption.

Transmission Performance:

On the insulating substrates of ceramics of the above samples, there was formed a high-frequency signal transmission line formed by a strip line and a coplanar line converted from an end of the strip line by the co-firing with the insulating substrates. The strip line was constituted by central conductors (Cu) having lengths of 1 cm, 2 cm and 3 cm, a width of 260 μm and a thickness of 10 μm formed on the surface of the insulating substrate, and a ground layer formed on the whole surface inside the insulating substrate (a distance between the central conductors and the ground layer was 150 μm).

Signals of 60 GHz were input from one end of the thus formed high-frequency signal transmission line, and $S_{21}$ representing the transmission performance of signals was measured at the other end by using a network analyzer.

TABLE 1

| | Starting material composition (% by weight) | | | | | | | | | Firing Conditions | |
|---|---|---|---|---|---|---|---|---|---|---|---|
| | Glass | | | Filler | | | | Others | | Temperature | Time |
| | | | | | amorphous SiO$_2$ | | | | | | |
| Sample No. | Kind | % by wt | ZnO (% by wt) | % by wt | Average particle diameter (μm) | ≥2μm ratio (%) | Impurity (ppm) | Kind | % by wt | (° C.) | (hr) |
| *1 | A | 90 | 2 | 8 | 1.2 | 20 | 250 | — | — | 900 | 1 |
| 2 | A | 80 | 10 | 10 | 1.2 | 20 | 250 | — | — | 950 | 0.5 |
| 3 | A | 75 | 10 | 15 | 1.2 | 20 | 250 | — | — | 950 | 1 |
| 4 | A | 75 | 5 | 20 | 1.2 | 20 | 250 | — | — | 925 | 1 |
| 5 | A | 75 | 15 | 10 | 1.2 | 20 | 250 | — | — | 975 | 1 |
| 6 | A | 70 | 10 | 20 | 0.9 | 10 | 250 | — | — | 950 | 1 |
| 7 | A | 65 | 15 | 20 | 1.2 | 20 | 250 | — | — | 950 | 2 |
| *8 | A | 50 | 40 | 10 | 1.2 | 20 | 250 | — | — | 1000 | 1 |
| *9 | A | 80 | — | — | — | — | — | quartz | 20 | 950 | 1 |
| *10 | A | 80 | — | — | — | — | — | alumina | 20 | 950 | 1 |
| *11 | A | 75 | — | — | — | — | — | CaO | 25 | 925 | 1 |
| *12 | A | 75 | 10 | 15 | 0.8 | 3 | 800 | — | — | 950 | 1 |
| *13 | A | 75 | 10 | 15 | 1.2 | 20 | 2000 | — | — | 950 | 1 |
| *14 | B | 90 | 2 | 8 | 1.2 | 20 | 250 | — | — | 925 | 1 |
| 15 | B | 75 | 10 | 15 | 1.2 | 20 | 250 | — | — | 950 | 1 |
| 16 | B | 70 | 20 | 10 | 1.2 | 20 | 250 | — | — | 950 | 1 |
| 17 | B | 75 | 15 | 10 | 1.2 | 20 | 250 | — | — | 975 | 1 |
| *18 | B | 80 | — | — | — | — | — | quartz | 20 | 975 | 1 |
| *19 | B | 75 | 10 | 15 | 0.8 | 3 | 1000 | — | — | 975 | 1 |
| *20 | B | 75 | 10 | 15 | 1.2 | 20 | 900 | — | — | 950 | 1 |
| *21 | C | 75 | 10 | 15 | 1.2 | 20 | 250 | — | — | 800 | 1 |
| *22 | C | 50 | 15 | 35 | 1.2 | 20 | 250 | — | — | 875 | 1 |
| *23 | D | 75 | 10 | 15 | 1.2 | 20 | 250 | — | — | 800 | 1 |
| *24 | D | 60 | 25 | 15 | 1.2 | 20 | 250 | — | — | 850 | 1 |
| *25 | A | 75 | 10 | 15 | 1.2 | 20 | 250 | — | — | 950 | 1 |

Samples marked with * lie outside the scope of the invention.

TABLE 2

| Sample No. | Dielectric constant | tan δ (×10$^{-4}$) 15Ghz | tan δ (×10$^{-4}$) 60Ghz | Strength (MPa) | Coefficient of thermal expansion (ppm/° C.) | $S_{21}$ dB/cm | Crystal phase (% by weight) [1] | | | | | Amorphous phase % by wt | Amorphous phase Element contained | Residual carbon (ppm) |
|---|---|---|---|---|---|---|---|---|---|---|---|---|---|---|
| | | | | | | | SP | E | Si | W | others | | | |
| *1 | 6.1 | 20 | 24 | 180 | 4.9 | −1.0 | 28 | 2 | — | 2 | Co 4 | 64 | Si>B | 60 |
| 2 | 4.9 | 9 | 10 | 200 | 5.2 | −0.5 | 35 | 6 | 4 | 2 | — | 53 | Si | 50 |
| 3 | 4.8 | 5.5 | 7.0 | 205 | 5.5 | −0.5 | 37 | 6 | 3 | 3 | — | 51 | Si | 40 |
| 4 | 4.7 | 7.5 | 8 | 210 | 5.1 | −0.5 | 39 | 5 | 6 | — | — | 50 | Si | 40 |
| 5 | 5.0 | 6 | 9 | 210 | 6.0 | −0.5 | 38 | 8 | — | 6 | Co 4 | 44 | Si | 70 |
| 6 | 4.7 | 8 | 9 | 200 | 5.0 | −0.5 | 34 | 7 | 6 | 4 | Co 8 | 41 | Si | 60 |
| 7 | 5.3 | 10 | 11 | 220 | 5.6 | −0.5 | 40 | 5 | 6 | 7 | — | 42 | Si>B | 50 |
| *8 | | | | | — did not become dense — | | | | | | | | | 80 |
| *9 | 4.8 | 17 | 18 | 170 | 10.5 | −0.8 | 17 | 3 | 46 | — | Co 2, Co 5 | 32 | Si>Al>Mg | 80 |
| *10 | 6.0 | 16 | 30 | 250 | 5.8 | −1.4 | 34 | 4 | — | — | Fo 3, Al$_2$O$_3$ 18 | 36 | Si>Al>Mg>B | 70 |

TABLE 2-continued

| Sample No. | Dielec-Tric constant | tan δ (x10⁻⁴) 15Ghz | (x10⁻⁴) 60Ghz | Strength (MPa) | Coefficent of thermal expansion (ppm/° C.) | $S_{21}$ dB/cm | Crystal phase (% by weight) [1] SP | E | Si | W | others | Amorphous phase % by wt | Element contained | Residual carbon (ppm) |
|---|---|---|---|---|---|---|---|---|---|---|---|---|---|---|
| *11 | 7.0 | 40 | 100 | 200 | 5.9 | −2.4 | 32 | — | — | — | An 58 | 10 | Si>Ca,Al,Mg | 60 |
| *12 | 4.9 | 6.5 | 16 | 240 | 9.0 | −1.0 | 36 | 3 | 8 | 3 | — | 50 | Si | 60 |
| *13 | 5.0 | 18 | 21 | 190 | 8.1 | −1.0 | 34 | 3 | 14 | 1 | — | 48 | Si>B | 70 |
| *14 | 6.4 | 17 | 20 | 180 | 4.6 | −1.0 | 28 | 4 | 3 | 4 | — | 61 | Si>Al>Mg>B | 80 |
| 15 | 5.2 | 7 | 8 | 230 | 5.8 | −0.5 | 32 | 9 | 5 | 4 | — | 50 | Si | 90 |
| 16 | 5.5 | 9 | 10 | 250 | 5.9 | −0.5 | 32 | 12 | 4 | 4 | — | 48 | Si | 60 |
| 17 | 5.7 | 8 | 9 | 250 | 6.0 | −0.5 | 32 | 9 | 3 | 2 | — | 54 | Si | 60 |
| *18 | 5.0 | 19 | 20 | 170 | 8.2 | −1.0 | 23 | 2 | 22 | 1 | — | 52 | Si>Al>Mg>Zn,B | 50 |
| *19 | 5.4 | 11 | 21 | 240 | 6.4 | −1.0 | 26 | 10.2 | 10 | 2 | — | 51.8 | Si | 70 |
| *20 | 5.3 | 23 | 25 | 220 | 7.5 | −1.1 | 24 | 6 | 17 | 3 | — | 50 | Si>Al>Mg>B | 60 |
| *21 | | measurement impossible | | | | — | 6 | — | 4 | 10 | — | 80 | Si,B,Na,Zn,Al | 50 |
| *22 | 5.5 | 80 | >100 | 175 | 6.6 | — | 6 | — | 14 | 8 | — | 72 | Si,B,Na,Zn,Al | 60 |
| *23 | | measurement impossible | | | | — | 5 | — | — | — | An 12 | 83 | Ca,Al,Si,B | 70 |
| *24 | 6.0 | 60 | >100 | 180 | 7.1 | — | 28 | — | — | — | An 10 | 62 | Ca,Al,Si,B | 80 |
| *25 | 4.9 | 12 | 17 | 170 | 5.4 | −0.7 | 36 | 4 | 4 | 4 | — | 52 | Si | 190 |

Samples marked with * lie outside the scope of the invention.
[1] SP: spinel crystal phase
E: enstatite crystal phase
Si: quartz
W: willemite crystal phase
Co: cordierite crystal phase
Fo: forsterite crystal phase
$Al_2O_3$: alumina
An: anorthite crystal phase As will be obvious from Tables 1 and 2, in the samples Nos. 1 and 14 in which the amount of glass containing $SiO_2$, $Al_2O_3$, MgO, ZnO and $B_2O_3$ was not smaller than 85% by weight, the crystal phase containing ZnO and $Al_2O_3$ was precipitated at a ratio of smaller than 30% by weight, and the crystal phase containing $SiO_2$ and MgO was precipitated at a ratio of smaller than 5% by weight. Besides, the dielectric losses were large and the ceramic strengths were low. In a sample No. 8 containing the glass in an amount of smaller than 65% by weight, on the other hand, the ceramics could not be obtained in a dense form at temperatures of not higher than 1000° C.

In the samples Nos. 9 to 11 and 18 to which other ceramic filler powders were added in place of ZnO powder and amorphous silica powder, metal components other than Si and B remained in the amorphous phase of the ceramics resulting in an increase in the dielectric loss of the ceramics.

In the samples Nos. 12, 13, 19 and 20 containing, in the amorphous silica starting material, impurity metals such as Al, Fe and Sb in a total amount of larger than 500 ppm, crystallization of amorphous silica was promoted, the amount of quartz precipitated in the ceramics exceeded 6% by weight and the dielectric loss tended to increase at 60 GHz (high-frequency band).

In the samples Nos. 21 to 24 using glasses C and D not containing any one of $SiO_2$, $Al_2O_3$, MgO, ZnO and $B_2O_3$, the dielectric losses were large.

On the other hand, the ceramics of samples Nos. 2 to 7 and 15 to 17 obtained by using the glasses A and B containing all of $SiO_2$, $Al_2O_3$, MgO, ZnO and $B_2O_3$ and being mixed with particular amounts of the ZnO powder and the highly pure amorphous silica powder, exhibited excellent properties, such as dielectric constants of not larger than 5.7, dielectric losses at 15 GHz of not larger than $10 \times 10^{-4}$, dielectric losses at 60 GHz of not larger than $15 \times 10^{-4}$, strengths of not smaller than 200 MPa and coefficients of thermal expansion of not larger than 5 to 6 ppm/° C.

In the sample No. 25 which was subjected to the heat treatment of one stage to remove the binder, the amount of the residual carbon was larger than 100 ppm and the dielectric loss was great.

Experiment 2:

In this experiment, the ceramics containing the Co component were evaluated.

As the crystallized glasses, first, the glasses A and B used in experiment 1 were used.

To the glass powders were mixed an amorphous silica powder and a cobalt oxide ($Co_3O_4$) powder at ratios shown in Table 3 to prepare mixed powders (in Table 3, the amount of cobalt oxide is a value calculated as CoO).

As the amorphous silica powder, further, there was used the one that was used for the sample No. 4 in Experiment 1.

Further, the following three kinds of cobalt oxide powders (a), (b), (c) were used.

Cobalt oxide powder (a): BET specific surface area of 40 g/m².

Cobalt oxide powder (b): BET specific surface area of 10 g/m².

Cobalt oxide powder (c): BET specific surface area of 1 g/m².

To 100% by weight of the above mixed powder were added 12% by weight of an isobutyl methacrylate resin (organic binder) as a solid component, 6% by weight of a dibutyl phthalate (plasticizer), and a mixed solvent of toluene/ethyl acetate, and the mixture was mixed together by using a ball mill for 40 hours to prepare a slurry.

By using the thus obtained slurry, a green sheet having a thickness of 0.25 mm was molded by the doctor blade method.

Eight pieces of the thus obtained green sheets were laminated one upon another with the application of pressure in the same manner as in Experiment 1, and the laminate was cut into a square having a side measuring 60 mm to obtain a molded article for obtaining the insulating substrate.

To the Cu powder were added a glass powder, a ceramic powder, an organic binder, a plasticizer and a solvent to prepare a Cu paste which was then printed onto the surface of the green sheet obtained above in a square shape of a side measuring 12 mm. The green sheet (Cu sheet) on which the Cu paste was printed and two pieces of green sheets on which no Cu paste was printed, were overlapped one upon the other such that the Cu sheet was the uppermost layer, and were laminated with the application of pressure in the same manner as in Experiment 1. The laminate was then cut into a square having a side of 24 mm to prepare a molded article for obtaining the wiring board.

The thus obtained molded article for an insulating substrate and the molded article for a wiring board were subjected to the heat treatment in two stages to remove the binder in the same manner as in Experiment 1, followed by firing at temperatures shown in Table 3 to obtain an insulating substrate and a wiring board having a Cu conductor layer.

With respect to the insulating substrate, its dielectric constant and dielectric loss (tan δ) at 60 GHz were measured in the same manner as in Experiment 1. Further, the number of protuberance-like defects on the insulating substrate was measured by eyes, and the deflective strength and the amount of residual carbon were measured in the same manner as in Experiment 1. Moreover, the brightness L* and the chroma C* in the L*a*b color display system were measured.

As for the wiring board, the surface of the Cu conductor layer was etched and, then, the nonelectrolytic Ni layer was plated maintaining a thickness of 3 μm followed by the plating of a nonelectrolytic Au layer maintaining a thickness of 1 μm. The surface of the substrate on where no Cu conductor layer has been formed was observed by using a stereomicroscope of a magnification of 40 times to observe the discoloration due to the adhesion of Au.

The results were as shown in Table 4.

TABLE 3

| No | Recipe composition (% by wt) | | | | | | | Firing temperature (° C.) |
|---|---|---|---|---|---|---|---|---|
| | Glass | | | | Filler | | | |
| | | | | | | $Co_3O_4$ | | |
| | A | B | ZnO | $SiO_2$ | a | b | c | |
| 1 | 75 | 0 | 10 | 15 | 0 | 0 | 0 | 925 |
| 2 | 75 | 0 | 10 | 15 | 0.03 | 0 | 0 | 925 |
| 3 | 75 | 0 | 10 | 15 | 0.05 | 0 | 0 | 925 |
| 4 | 75 | 0 | 10 | 15 | 0.2 | 0 | 0 | 925 |
| 5 | 75 | 0 | 10 | 15 | 0.4 | 0 | 0 | 925 |
| 6 | 75 | 0 | 10 | 15 | 1 | 0 | 0 | 925 |
| 7 | 75 | 0 | 10 | 15 | 2 | 0 | 0 | 925 |
| 8 | 75 | 0 | 10 | 15 | 4 | 0 | 0 | 925 |
| 9 | 75 | 0 | 10 | 15 | 5 | 0 | 0 | 925 |
| 10 | 75 | 0 | 10 | 15 | 6 | 0 | 0 | 925 |
| 11 | 0 | 75 | 10 | 15 | 0 | 0 | 0 | 950 |
| 12 | 0 | 75 | 10 | 15 | 0.5 | 0 | 0 | 950 |
| 13 | 0 | 75 | 10 | 15 | 1 | 0 | 0 | 950 |
| 14 | 0 | 75 | 10 | 15 | 5 | 0 | 0 | 950 |
| 15 | 0 | 75 | 10 | 15 | 6 | 0 | 0 | 950 |
| 16 | 75 | 0 | 10 | 15 | 0 | 0.2 | 0 | 925 |
| 17 | 75 | 0 | 10 | 15 | 0 | 0.4 | 0 | 925 |
| 18 | 75 | 0 | 10 | 15 | 0 | 0.6 | 0 | 925 |
| 19 | 75 | 0 | 10 | 15 | 0 | 0 | 0.4 | 925 |

TABLE 4

| Sample No. | Strength (MPa) | Dielectric constant | tan δ (×10⁻⁴) | Adhesion of Au | Ceramic color L* | Ceramic color C* | No. of protruded defects/cm² | Color of molded article | Residual carbon (ppm) |
|---|---|---|---|---|---|---|---|---|---|
| 1 | 220 | 4.9 | 8.3 | yes | 92 | 0.1 | 0.1 | white | 70 |
| 2 | 210 | 4.9 | 8.4 | yes | 80 | 24 | 0.2 | brown | 60 |
| 3 | 220 | 4.9 | 8.3 | no | 79 | 25 | 0.1 | brown | 50 |
| 4 | 220 | 4.9 | 8.5 | no | 76 | 28 | 0.1 | brown | 60 |
| 5 | 210 | 4.9 | 8.5 | no | 75 | 29 | 0.2 | brown | 70 |
| 6 | 220 | 4.9 | 9 | no | 73 | 31 | 0.1 | brown | 70 |
| 7 | 220 | 4.9 | 10.5 | no | 70 | 32 | 0.2 | brown | 60 |
| 8 | 220 | 5.0 | 12 | no | 68 | 35 | 0.1 | brown | 40 |
| 9 | 210 | 5.0 | 15 | no | 65 | 35 | 0.1 | brown | 80 |
| 10 | 220 | 5.2 | 18 | no | 64 | 36 | 0.1 | brown | 90 |
| 11 | 210 | 4.8 | 7.4 | yes | 92 | 0.1 | 0.1 | brown | 80 |
| 12 | 210 | 4.8 | 7.4 | no | 75 | 29 | 0.1 | brown | 70 |
| 13 | 220 | 4.9 | 7.4 | no | 73 | 31 | 0.1 | brown | 60 |
| 14 | 230 | 4.8 | 14 | no | 65 | 35 | 0.2 | brown | 60 |
| 15 | 220 | 4.9 | 17 | no | 64 | 36 | 0.1 | brown | 50 |
| 16 | 210 | 4.9 | 8.5 | no | 78 | 25 | 0.1 | brown | 50 |
| 17 | 210 | 4.9 | 8.5 | no | 77 | 26 | 0.1 | brown | 70 |
| 18 | 220 | 4.9 | 8.5 | no | 76 | 28 | 0.2 | brown | 70 |
| 19 | 220 | 4.9 | 8.5 | no | 80 | 18 | 10.0 | brown | 70 |

It will be learned from the results of Tables 3 and 4, that the ceramics (samples Nos. 1, 2, 11) containing the Co component in amounts smaller than 0.05% by weight were discolored by the adhesion of Au, but other ceramics containing the Co component in amounts not smaller than 0.05% by weight were effectively prevented from being discolored by the adhesion of Au.

The ceramics (samples Nos. 10 and 15) containing the Co component in amounts in excess of 5% by weight exhibited increased dielectric loses. In the ceramics (sample No. 19) having a specific surface area smaller than 10 m$^2$/g and using the cobalt oxide powder, the Co component had not been homogeneously dispersed and, hence, the protuberance-like defects developed in many number.

What is claimed is:

1. A high frequency wiring board comprising an insulating substrate formed of ceramics having excellent high-frequency characteristics which contain $SiO_2$, $Al_2O_3$, MgO, ZnO and $B_2O_3$, as constituent components, said ceramics comprising:

30 to 50% by weight of a crystal phase containing ZnO and $Al_2O_3$;

5 to 15% by weight of a crystal phase containing $SiO_2$ and MgO; and 40 to 60% by weight of an amorphous phase comprising substantially $SiO_2$ or $SiO_2$ and $B_2O_3$;

wherein the content of an $SiO_2$ crystal phase is suppressed to be not larger than 6% by weight, and the dielectric loss at 60 GHz is not larger than $15 \times 10^{-4}$, and a wiring layer which is formed on the surface of and/or inside of said insulating substrate and is capable of transmitting signals of high frequencies of not lower than 1 GHz.

2. The high-frequency wiring board according to claim 1, wherein said wiring layer is constituted by at least one kind of a strip line, a microstrip line, a coplanar line and a dielectric waveguide line, and is formed by the co-firing with said insulating substrate.

3. The high-frequency wiring board according to claim 2, wherein said wiring layer contains at least one kind of element selected from copper, silver and gold.

4. The high-frequency wiring board according to claim 1, wherein the wiring layer formed on the surface of said insulating substrate contains copper, and an Au layer is plated maintaining a thickness of 1 μm on said copper-containing wiring layer.

* * * * *